United States Patent [19]

Heckman, Jr. et al.

[11] 4,034,320

[45] July 5, 1977

[54] HIGH POWER COAXIAL CAVITY RESONATOR TUNABLE OVER A BROAD BAND OF FREQUENCIES

[75] Inventors: LeRoy Francis Heckman, Jr., New Holland, Pa.; James Bruce Pickard, Quincy, Ill.

[73] Assignee: RCA Corporation, New York, N.Y.

[22] Filed: Apr. 26, 1976

[21] Appl. No.: 680,076

[52] U.S. Cl. ................................ 333/82 B; 330/56; 331/97

[51] Int. Cl.[2] ........................ H01P 7/04; H03F 3/60

[58] Field of Search ............. 333/73 C, 82 R, 82 B, 333/83 R; 334/41, 44; 330/45, 56; 331/97, 98

[56] References Cited

UNITED STATES PATENTS

| | | | |
|---|---|---|---|
| 2,790,857 | 4/1957 | Gluyas, Jr. et al. | 330/56 |
| 2,840,647 | 6/1958 | Koros et al. | 330/56 |
| 2,922,957 | 1/1960 | Haszard | 333/82 B X |
| 3,153,765 | 10/1964 | Weaver | 330/56 |
| 3,452,293 | 6/1969 | DeLong et al. | 333/82 R X |
| 3,536,952 | 10/1970 | Findley | 333/83 R X |

*Primary Examiner*—Paul L. Gensler

*Attorney, Agent, or Firm*—Edward J. Norton; Robert L. Troike

[57] ABSTRACT

An output coaxial cavity for high power electron tubes is described in which the output coupler is directly connected to an intermediate coaxial conductor of the coaxial cavity at a distance from the tube that is greater than one-quarter wavelength and less than one-half wavelength over the tuning range of the cavity. The intermediate coaxial conductor is spaced between and concentric with an inner conductor and an outer conductor of the coaxial cavity. A first shorting stub is positioned between the inner conductor and the intermediate conductor and a second shorting stub is coupled between the intermediate conductor and the outer conductor. The positions of the shorting stubs are arranged to resonate the cavity at the desired tuning frequency.

6 Claims, 3 Drawing Figures

HIGH POWER COAXIAL CAVITY RESONATOR TUNABLE OVER A BROAD BAND OF FREQUENCIES

BACKGROUND OF INVENTION

This invention relates to resonators and more particularly to tunable coaxial cavity resonators for high power tubes.

Coaxial output cavity resonators are well known in the state of the art. The purpose of the output cavity of an active device is to transform the load impedance to an impedance suitable for the active device to develop the stated power output. High power tubes have a finite output capacitance. Real power can only be developed in the resistive portion of the tube load impedance; therefore, the output circuit must also resonate the tube output capacitance. The output circuit must be capable of operating with extremely high voltages and currents when handling high power. In a typical arrangement, a transmission line resonate cavity is added to the output of the tube and the RF power is coupled from the resonate cavity by either a coupling capacitor or by a coupling loop. Difficulty occurs when the circuit is operated over a broad range of frequencies. In attempting to maintain the desired power with changing frequencies in the case of the coupling capacitor, the capacitor may be moved too close to the transmission line causing voltage breakdown to occur. Similarly, in the coupling loop case when moving the loop in and out, the loop can be moved too close causing voltage breakdown to occur. A change in capacitor size or loop size or physically moving the coupler to another place in the line to increase power coupling would be time consuming and impractical with frequent frequency changes. Direct tap to the transmission line works but only at one frequency. Movable direct taps can provide tuning over a relatively broad range of frequencies but there are many applications where physically moving the output coupler is not desirable or not possible. The same is true for moving the capacitor or inductor.

Briefly, an improved coaxial cavity resonator for an active device which is tunable over a given band frequencies, is provided by an inner conductor, a coxial outer conductor, a third intermedite conductor and tuning stubs. The inner conductor and the coaxial outer conductor are coupled to the active device and the third intermediate conductor is spaced coaxially between the inner conductor and the outer conductor with the intermediate conductor beginning at a given distance along the cavity from the active device and extending to that end of the cavity remote from the active device. A fixed position output coupler is connected to the third intermediate conductor at the given distance from the active device. The inner and outer conductors are dimensioned and are of the given electrical length from the active device to where the intermediate conductor begins to present an inductive impedance at the inner and outer conductors at the coupling region of the output coupling device. The first of the shorting stubs is positioned between the inner conductor and the intermediate conductor, and the second of the shorting stubs is positioned between the intermediate conductor and the outer conductor. The stubs are positioned such that a capacitive reactance is presented across the inductive impedance to resonate therewith and selectively tune the cavity to frequencies over a given broad band. The relative position of the two coaxial stubs controls the transmission of the tube impedance to that of the load.

DESCRIPTION OF DRAWING

A more detailed description follows in conjunction with the following drawings wherein.

DETAILED DESCRIPTION

Figure 1:
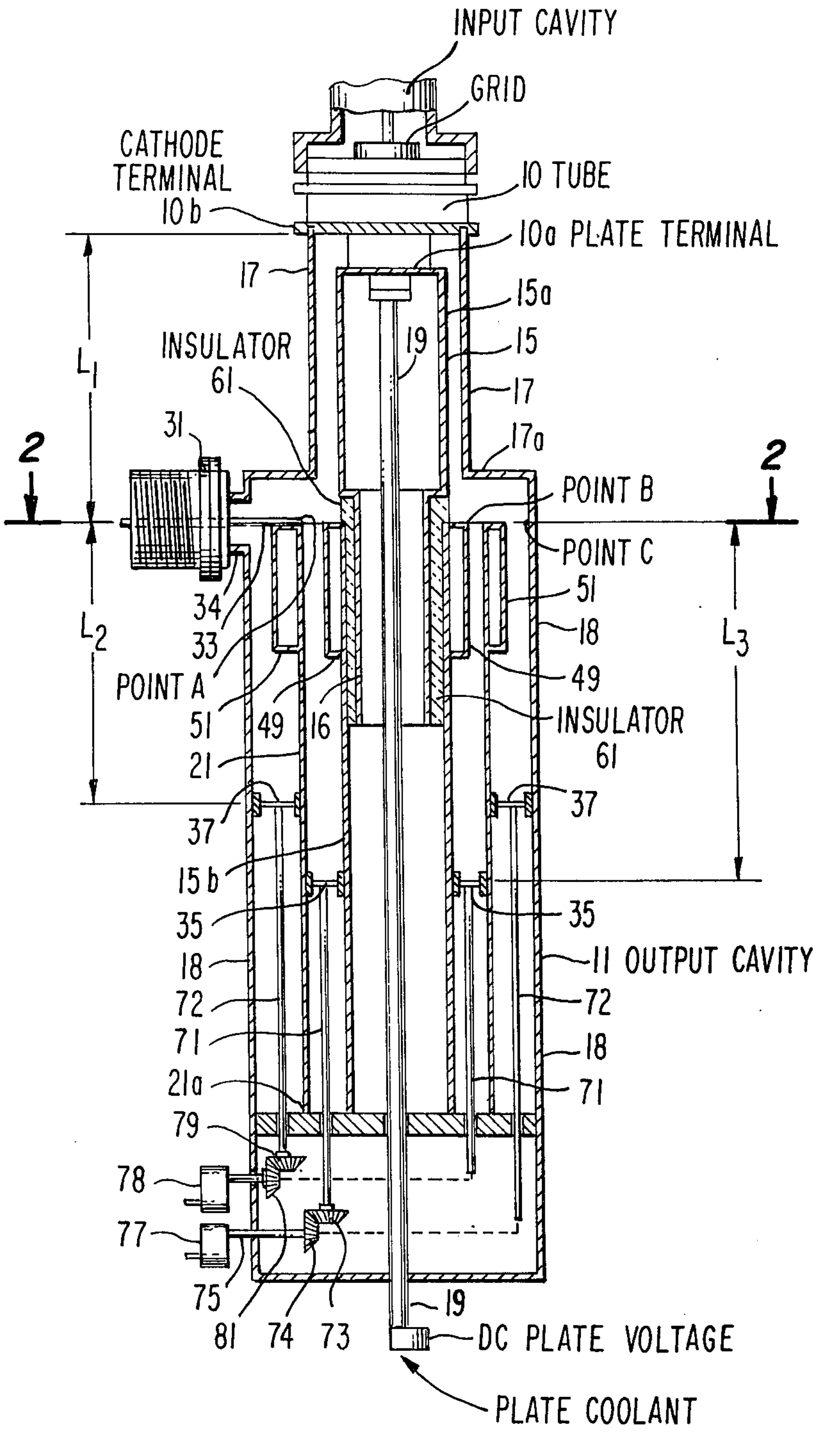
FIG. 1 is an elevation cross-sectional view of the output coaxial cavity according to a preferred embodiment of the present invention.
Figure 2:
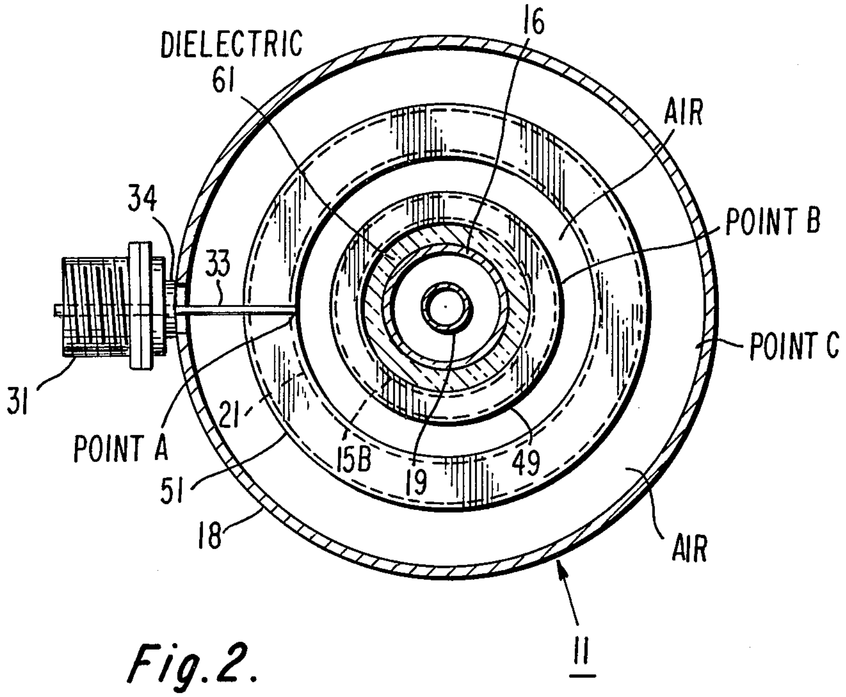
FIG. 2 is a top cross-sectonal view taken in plane 2–2 of FIG. 1.

Referring to FIGS. 1 and 2, there is illustrated by cross-sectional view an output coaxial cavity 11 for high power tube. The output coaxial cavity transforms the load impedance to an impedance suitable for the tube (active device). In this embodiment of FIG. 1, the power tube 10 is an RCA 6952 (sold by RCA Corp., Lancaster, Pa.) The tube 10 has a finite output capacitance. The RF resistance value presented to the electron beam in the active area of the tube is determined by the tuned RF circuit. To develop 250 kilowatts and operate the tube within ratings, the tuned circuit is adjusted to present 383 ohms to the active area. The cavity 11 is made tunable over a frequency range of for example 180 $MH_z$ to 280 $MH_z$. The cavity 11 is a coaxial cavity including a hollow tubular inner conductor 15 connected to the plate terminal 10*a* of tube 10, concentric outer conductors 17 and 18 coupled to grounded cathode terminal 10*b* and concentric intermediate conductor 21. Inside the inner conductor 15 is passed the coolant to plate 10*a* of tube 10 and the d.c. plate voltage via tube 19.

The inner conductor 15 is constructed of two sections 15*a* and 15*b* with one portion 16 of section 15*a* reduced in width near the output coupling region. Section 15*b* is outboard the portion 16 of the section 15*a*. The two portions 15*a* and 15*b* are separated over a given length (length of portion 16) by a body 61 of dielectric material. Although a.c. signals are coupled across this body 61, the d.c. on the plate 10*a* of tube 10 is blocked. Intermedite coaxial conductor 21 is spaced about and concentric with section 15*b* of inner conductor 15. The output coupling is provided by coaxial coupler 31. The inner conductor 33 of the output coupler 31 extends in insulated manner and is connected to the end of intermediate conductor 21 at point A. The intermediate conductor 21 extends in a direction away from the tube 10 to shorted end 21*a*. Outer conductor 17 is spaced concentric with inner conductor 15 over a given length from the tube 10 to a point near the output coupling point A of the cavity. Outer conductor 18 is concentric with and is spaced about both the inner conductor 15 and intermediate concentric conductor 21. Outer conductor 18 is joined to outer coaxial conductor 17 at a point slightly on the tube side of the coupler 31 via flange section 17*a*. The outer conductor 34 of coupler 31 is connected to outer conductor 18 near point A. The conductors 17, 18 and 34 are coupled to ground potential via the grounded cathode of tube 10.

The length $L_1$ of the coaxial cavity formed between the tube 10 and coupling point A is such that at the coupling points A, B and C in FIG. 1, the tube side of the cavity always looks inductive. The length ($L_1$) of the cavity from the tube 10 to coupling points A, B, and C is made so that with the tube the electrical length is greater than one-quarter wavelength (>λ/4) and less than one-half wavelength (>λ/2) over the tuning range of 180 $MH_z$ to 280 $MH_z$. The most useful value of inductance (and hence the particular length selected) for this application is one that can be resonated with the coupler terminated into a load such as 50 ohms, have RF power developed in the load such as 250 kilowatts, and present a desirable load to the active area of the tube such as 383 ohms.

The tuning and loading of the output cavity is accomplished by two concentric ring-like stubs 35 and 37 with the ring-like stub 35 coupled between inner conductor 15 and intermediate conductor 21 and the stub 37 coupled between intermediate conductor 21 and outer conductor 18. The concentric stubs 35 and 37 are movable conductive shorting plungers that terminate the lengths of the coaxial cavities formed by conductors 15 and 21 and 18 respectively. The coaxial line formed between outer conductor 18 and intermediate conductor 21 is in shunt with the load and hence is referred to as the loading cavity section and the coaxial line formed between center conductor 15 and intermediate conductor 21 is in series with the load and the tube 10 and is referred to as the tuning cavity section. The length $L_2$ of coaxial line formed between the outer conductor 18 and intermediate conductor 21 as determined by the position of stub 37 is selected so that the electrical length of this loading cavity section of line is greater than a quarter wavelength (>λ/4) and less than a half wavelength (>λ/2) long over the tuning range of 180 $MH_z$ to 280 $MH_z$. The length $L_3$ of the coaxial line formed between the inner conductor 15 and intermediate conductor 21, as determined by the position of stub 35, is selected so that the electrical length of this tuning coaxial cavity section of line is greater than a quarter wavelength (>λ/4) long and less than a half wavelength (>λ/2) long over the tuning range of 180 to 280 $MH_z$.

Figure 3:
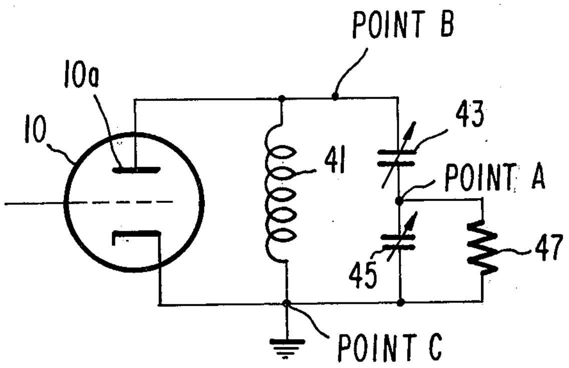
FIG. 3 is a schematic diagram of the output cavity of FIG. 1.

Referring to FIG. 3, there is illustrated a schematic of the structure shown in FIGS. 1 and 2. As stated previously, the tube 10 plus the coaxial section including inner conductor 15 and outer conductor 17 plus a portion of outer conductor 18 between conductor 17 and point A (length $L_1$) always provides between inner conductor 15 point B and outer conductor 18 point C an inductance. This inductance is represented by inductor 41 in FIG. 3. The stub 35 terminating the tuning cavity section provided by inner conductor 15 and intermediate conductor 21 provides between points A and B a tunable capacitance represented by capacitor 43 in series with the load. The stub 37 terminating the loading cavity section provided by intermediate conductor 21 and outer conductor 18 provides between points A and C a tunable capacitance across the coupler represented by capacitor 45. The coupler 31 is a 50 ohm transmission line. The coupler is represented in FIG. 3 by a 50 ohm load resistor 47. The combined series capacitances 43 and 45 (presented between points A and B, and between points A and C, in FIG. 1 respectively, determined by the position of the stubs 35 and 37) resonates with the parallel inductance 41 presented by the upper coaxial section and tube 10. The ratio of the stub impedances or the ratio of capacitors 43 and 45 controls the transformation of the load impedance to tube impedance.

By making the direct coupling point (tube plus coaxial line) greater than a quarter wavelength (>λ/4) and less than a half wavelength (<λ/2) the impedance is always inductive and the voltage is less than maximum between points B and C. The voltage between points B and C is rising and is divided between the tuning and loading coaxial cavity sections (tuning cavity between conductor **15*b* and 21 and loading cavity between conductors 21 and 18) and the voltage climbs to a maximum within the tuning and loading cavity sections. If sufficient voltage is reached within either of two concentric coaxial sections, excessive voltage breakdown can occur. This can be overcome by low impedance sections near the coupler in both the tuning and loading cavities. In the tuning cavity the low impedance section is formed by reducing spacing between the inner conductor 15 and intermediate conductor 21 by conductive ring element 49. This conductive ring element 49 surrounds and is connected to the inner conductor 15 near the coupler end. This conductive ring 49 extends a sufficient length along the cavity away from the tube so that over most of the operating band the rising voltage is in the low impedance region. In the loading cavity, the low impedance section is formed by reducing the spacing between the outer conductor 18 and intermediate conductor 21 by a second conductive ring element 51. This conductive element 51 surrounds and is connected to the intermediate conductor 21 near the coupler end. The conductive ring 51 extends a sufficient length so that over most of the operating band the rising voltage is in the low impedance region to thereby prevent the voltage from reaching the breakdown voltage. The maximum lengths of elements 49 and 51 are limited by the amount of travel remaining for the adjustable shorting stubs 35 and 37 in the cavity at the high frequency end of the operating band. The capacitive reactances required can be achieved by adjusting the cavity lengths by the stubs 35 and 37** and selecting the appropriate diameters of the inner conductor, intermediate conductor and outer conductors using the known equation $$jB = \frac{-jY_o}{\tan \beta l} \text{ rewritten to } \frac{1}{X_S} = \frac{-j\left(\frac{1}{Z_o}\right)}{\tan \beta l}, \text{ where}$$

where $X_S$ is the desired capacitive reactance, $Z_O$ is the characteristic impedance of the line as governed by the ratio of the diameters of the (inner and outer) conductors, $\beta = 360°/\lambda$ and $l$ is the length of the line section. The solution is a bit more complicated by the dual characteristic impedance $Z_O$ but the solution can be had by first solving for the high impedance section, converting to electrical degrees into low impedance section equivalent, then add the degrees to the low impedance section $\beta l$ and solve for capacitive reactance. A cavity as described above was constructed and had the following dimensions: $L_1$ = 11.0 inches of element 17 plus 1.5 inches of element 18 = 12.5 inches total, $L_2$ = 7 inches + 18.76 inches at 180 MHz and $L_2$ = 7 inches + 1.04 inches at 280 MHz. Length of element 51 is 7 inches. $L_3$ = 6.5 inches + 24.7 inches at 180 MHz and 6.5 inches + 3.56 inches at 280 MHz. Length of element 49 is 6.5 inches. Conductor 15 is 4.5 inches O.D., conductor 17 is 7 inches I.D. and is 11 inches long, condutor 18 is 11.0 inches I.D., and conductor 21 is 8.250 inches O.D. and 8 inches I.D. Element 49 is 5.5 inches O.D. and element 51 is 9.5 inches O.D. The portion 16 is 9.90 inches long 3.7 inches O.D. Section **15*b* is 4.1inches O.D. Insulator body 61** has a dielectric constant of 2.75.

Tuning of the cavity is provided by ring-like stubs or plungers which are slid up and down the cavities by threaded screws 71 and 72 coupled to the stubs 35 and 37 respectively. A gear 73 is coupled to the bottom end of the screws 72 and is mated with a gear 74. Gear 74 as shown in FIG. 1 is coupled via shaft 75 to a crank 77. Movement of the crank 77 produces either upward or downward movement of stub 37. Similarly the bottom of screw 72 is coupled to crank 78 vias gears 79 and 81. The screws 71 and 72 are threaded into threaded apertures in the bottom **17*a*** of the cavity.

A cavity like that described above with slight modifications was made tunable over the frequency range of 180 $MH_z$ to 1000 $MH_z$. This is achieved in five discrete frequency steps with five frequency determining assembly changes. The first step is as discussed above from 180 $MH_z$ to 280 $MH_z$. The second step is from 280 to 400 $MH_z$, the third step is from 400 to 550 $MH_z$, the fourth step is from 550 to 935 $MH_z$ and the fifth step is from 935 $MH_z$ to 1000. Each assembly consists of a tube extender, an inner conductor/blocker, with low impedance section 49, and a low impedance loading section 51. The tube extender is that section of the cavity illustrated in FIG. 1 as including coaxial outer conductor 17. This section is made progressively shorter in each frequency determining assembly so as to make the tube plus the extender inductive throughout the band as discussed previously. The inner conductor is shortened to correspond with the changes in the outer conductor 17. Also, the low impedance sections (provided by rings 49 and 51) are again adjusted in length to minimize the voltage gradient in the concentric coaxial sections. The low impedance section length for each tuning and loading section was designed to have maximum RF voltage occur within the low impedance section at the highest operating frequency of each tuning ranges from 180 thru 935 $MH_z$. The low impedance lengths (length of rings 49 and 51 in FIG. 1) for each range was greater than λl8 wavelength and less than λ/4 wavelength with maximum length consideration tempered by the amount of travel remaining for adjustable shorts 35 and 37 within high impedance sections formed by elements **15*b* and 21, and 21 and 18 respectively. The tuning low impedance section is greater than one-quarter wavelength in the frequency range from 935 to 1000 $MH_z$. The loading low impedance section was less than one-quarter wavelength in the frequency range of 935 to 1000 $MH_z$. The RCA 6952** tube was used to cover the frequencies from 180 to 400 $MH_z$ and the RCA tube A2606 was used from the 400 to 1000 $MH_z$ band.

What is claimed is:

1. A coaxial cavity resonator for an active device tunable over a given broad band of frequencies comprising:

a first conductor for coupling to one terminal of said active device, a second tubular conductor concentric with and spaced about said first conductor for coupling to a second terminal of said active device, a third intermediate tubular conductor coaxially spaced between said first and second conductor, said third intermediate tubular conductor beginning at a given distance along said cavity from said active device and extending to that end of said cavity remote from said active device, a fixed position output coupler having a given impedance with a first terminal directly connected to said third conductor at said given distance from said active device and a second terminal connected to said second conductor, said first and second conductors being dimensioned to present over said given band of frequencies an inductive impedance across said first and second conductors at said given distance from said active device, a pair of concentric shorting stubs with a first stub positioned between said third conductor and said first conductor to present a first capacitive reactance at said given distance from said active device and a second stub positioned between said third conductor and said second conductor to present a second capacitive reactance at said given distance from said active device in series with said first capacitive reactance and in shunt with said coupler, said stubs being adjustable for resonating the inductive reactance therewith to tune said cavity over said broad band of frequencies.

2. The combination of claim 1 wherein said output coupler is a coaxial conductor and said second terminal is the outer conductor and said first terminal is the inner conductor.

3. The combination of claim 1 wherein the length of said first and second conductors from said active device to said beginning of said third intermediate tubular conductor is determined such that with said active device the electrical length is greater than one-quarter wavelength (>λ/ 4) and less than one-half wavelength (<λ/2) over said band.

4. The combination of claim 3 wherein the electrical length of said third conductor and said first and second conductors from said beginning of third intermediate tubular conductor to said stubs is made greater than one-quarter wavelength and less than one-half wavelength over said band.

5. The combination of claim 4 including means for reducing the impedance of said coaxial line formed between said first and third conductor and said second and third conductors.

6. The combination of claim 5 including a conductive ring connected to and surrounding said first and said third conductors over a length less than approximately one-quarter wavelength at the highest frequency of said band.

* * * * *

UNITED STATES PATENT OFFICE
CERTIFICATE OF CORRECTION

PATENT NO. : 4,034,320

DATED : July 5, 1977

INVENTOR(S) : LeRoy F. Heckman, Jr. et al

It is certified that error appears in the above-identified patent and that said Letters Patent are hereby corrected as shown below:

In Column 3, line 5, "$>\lambda/2$" should read -- $<\lambda/2$ --; line 21, "15 and 21 and 18" should read -- 15 and 21 and 21 and 18 --; line 33 "$>\lambda/2$" should read -- $<\lambda/2$ --; line 40 "$>\lambda/2$" should read -- $<\lambda/2$ --. Column 4, line 45, cancel "where". Column 5, line 43, "λ18" should read -- $\lambda/8$ --.

Signed and Sealed this

*Twentieth* Day of *December 1977*

[SEAL]

*Attest:*

RUTH C. MASON
*Attesting Officer*

LUTRELLE F. PARKER
*Acting Commissioner of Patents and Trademarks*